United States Patent
Shan et al.

(10) Patent No.: US 8,482,694 B2
(45) Date of Patent: Jul. 9, 2013

(54) LIQUID CRYSTAL MODULE AND METHOD FOR ASSEMBLING THEREOF

(75) Inventors: Hsu Shan, Kaohsiung (TW); I-Ting Huang, Kaohsiung (TW); Shin-Chang Chen, Kinmen County (TW)

(73) Assignee: Chunghwa Picture Tubes, Ltd., Padeh, Taoyuan (TW)

( * ) Notice: Subject to any disclaimer, the term of this patent is extended or adjusted under 35 U.S.C. 154(b) by 200 days.

(21) Appl. No.: 13/088,810

(22) Filed: Apr. 18, 2011

(65) Prior Publication Data

US 2012/0194759 A1    Aug. 2, 2012

(30) Foreign Application Priority Data

Jan. 28, 2011    (TW) .............................. 100103322 A

(51) Int. Cl.
*G02F 1/1333*    (2006.01)
(52) U.S. Cl.
USPC .......................................................... 349/58
(58) Field of Classification Search
USPC .......................................................... 349/58
See application file for complete search history.

(56) References Cited

U.S. PATENT DOCUMENTS

| 2010/0007814 A1* | 1/2010 | Kim ................................ 349/58 |
| 2010/0007816 A1* | 1/2010 | Lee ................................ 349/58 |
| 2010/0141865 A1 | 6/2010 | Jung |
| 2010/0283936 A1* | 11/2010 | Ji et al. ........................... 349/58 |
| 2012/0194761 A1* | 8/2012 | Nakano ............................ 349/58 |

FOREIGN PATENT DOCUMENTS

| CN | 101201507 A | 6/2008 |
| CN | 101556007 A | 10/2009 |
| TW | 523651 | 3/2003 |

* cited by examiner

*Primary Examiner* — Sung Pak
(74) *Attorney, Agent, or Firm* — Muncy, Geissler, Olds & Lowe, PLLC

(57) ABSTRACT

A liquid crystal module includes a housing, a light guide plate, at least one optical film, a liquid crystal panel, and a light bar. The housing includes a bottom plate with a bearing surface and a frame wall connected to the bottom plate. The light guide plate is disposed on the bearing surface and has a light emitting surface and a light incident side surface. The frame wall surrounds the light guide plate. The optical film is disposed above the light emitting surface. The liquid crystal panel is disposed above the optical film. The light bar includes a first circuit board and at least one light emitting element mounted on the first circuit board. The light emitting element is located opposite to the light incident side surface. The first circuit board located between the liquid crystal panel and the light emitting surface partially covers the light emitting surface.

13 Claims, 3 Drawing Sheets

LIQUID CRYSTAL MODULE AND METHOD FOR ASSEMBLING THEREOF

CROSS-REFERENCE TO RELATED APPLICATION

This application claims the benefit of Taiwan Patent Application No. 100103322, filed on Jan. 28, 2011, which is hereby incorporated by reference for all purposes as if fully set forth herein.

BACKGROUND OF THE INVENTION

1. Field of Invention

The present invention relates to a liquid crystal display (LCD) and a method for assembling thereof, and more particularly to a liquid crystal module (LCM) and a method for assembling thereof.

2. Related Art

At present, some LCDs employ a backlight module having a light guide plate, in which the light guide plate has a light emitting surface and a light incident side surface connected to the light emitting surface, and a light source is disposed opposite to the light incident side surface. When the light source emits light rays, the light rays enter to the light incident side surface first, and then is emitted from the light emitting surface. However, light leakage sometimes happens in such LCDs using the light guide plate. In detail, when the light source emits light rays, many light rays are emitted from where the light emitting surface is close to the light incident side surface, thereby causing that the brightness of screen is not uniform and affecting the picture quality of the LCD.

SUMMARY OF THE INVENTION

The present invention provides a liquid crystal module capable of reducing the occurrence of light leakage.

The present invention provides a liquid crystal module including a housing, a light guide plate disposed on the bearing surface, at least one optical film disposed above the light emitting surface, a liquid crystal panel disposed above the optical film, and a light bar including a first circuit board and at least one light emitting element. The housing includes a bottom plate having a bearing surface and a frame wall connected to the bottom plate and protruding from the bearing surface. The light guide plate having a light emitting surface, a bottom surface, and a light incident side surface connected between the light emitting surface and the bottom surface. The bottom surface is located opposite to the bearing surface. The frame wall surrounds the light guide plate. The light emitting element is mounted on the first circuit board and located opposite to the light incident side surface, and between the first circuit board and the bearing surface. The first circuit board is located between the liquid crystal panel and the light emitting surface, and partially covers the light emitting surface.

The present invention also provides a method for assembling a liquid crystal module. First, a housing comprising a bottom plate and a frame wall is provided. The bottom plate has a bearing surface, and the frame wall is connected to the bottom plate and protrudes from the bearing surface. Next, a light guide plate is placed on the bearing surface, and the light guide plate has a light emitting surface, a bottom surface, and a light incident side surface connected between the light emitting surface and the bottom surface. The bottom surface is located opposite to the bearing surface, and the frame wall surrounds the light guide plate. A light bar is placed inside the housing after the light guide plate is placed on the bearing surface. The light bar comprises a first circuit board and at least one light emitting element. The light emitting element is mounted on the first circuit board and located opposite to the light incident side surface, and between the first circuit board and the bearing surface. The first circuit board partially covers the light emitting surface. At least one optical film is placed above the light emitting surface. Then, a liquid crystal panel is placed above the optical film. The first circuit board is located between the liquid crystal panel and the light emitting surface.

As the first circuit board of the light bar partially covers the light emitting surface of the light guide plate, some light rays originally to be emitted from where the light emitting surface close to the light incident side surface are blocked. Therefore, the liquid crystal module of the present invention can reduce the occurrence of light leakage.

In order to make the aforementioned features and advantages of the present invention more comprehensible, embodiments accompanied with figures are described in detail below.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1:
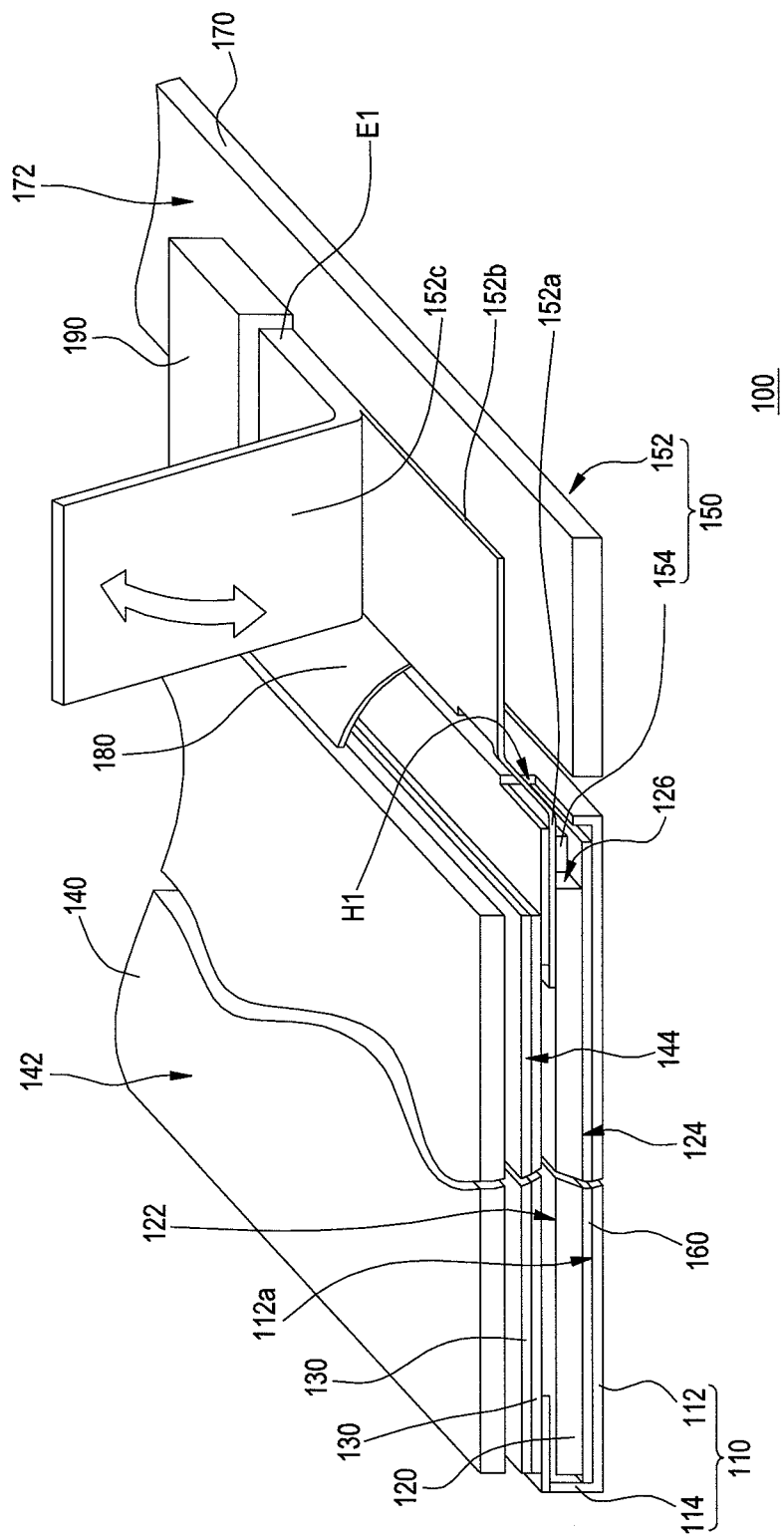
FIG. 1 is a schematic three-dimensional cross-sectional view of a liquid crystal module according to an embodiment of the present invention.

FIG. 1 is a schematic three-dimensional cross-sectional view of a liquid crystal module according to an embodiment of the present invention. Referring to FIG. 1, in this embodiment, a liquid crystal module 100 may be used to fabricate a liquid crystal display television (LCD TV) or a liquid crystal display computer screen, or applied in an electronic device such as a mobile phone, a laptop and a personal digital assistant (PDA). For example, the liquid crystal module 100 may be used as a screen of the above electronic device.

The liquid crystal module 100 includes a housing 110, a light guide plate 120, at least one optical film 130, a liquid crystal panel 140, and a light bar 150. Although the liquid crystal module 100 as shown in FIG. 1 includes a plurality of optical films 130, the number of the optical films 130 included in the liquid crystal module 100 may be only one in other embodiment. The light guide plate 120 is disposed in the housing 110. The light bar 150 is disposed beside the light guide plate 120, and the optical films 130 and the liquid crystal panel 140 are all disposed above the light guide plate 120.

The housing 110 includes a bottom plate 112 and a frame wall 114 and may be a metal housing or a plastic housing, that is, the material of the housing 110 may be metal or plastic. The bottom plate 112 has a bearing surface 112a, and the frame wall 114 is connected to the bottom plate 112 and protrudes from the bearing surface 112a. The light guide plate 120 is disposed on the bearing surface 112a, and the frame wall 114 surrounds the light guide plate 120, so that the light guide plate 120 is disposed inside the housing 110.

In addition, depending on the type of the electronic device applying to the liquid crystal module 100, the housing 110 may also be a housing employed by the electronic device. For example, when the liquid crystal module 100 is used as a screen of a laptop, the housing 110 may be a front cover of the laptop, and the front cover is, for example, so-called Part A in an ordinary factory for assembling laptops. Therefore, the housing 110 may be a part that the liquid crystal module 100 and the electronic device share.

The light guide plate 120 has a light emitting surface 122, a bottom surface 124, and a light incident side surface 126 connected between the light emitting surface 122 and the bottom surface 124, in which the bottom surface 124 is opposite to the light emitting surface 122, and the bottom surface 124 is located opposite to the bearing surface 112a. The optical films 130 are disposed above the light emitting surface 122, and the liquid crystal panel 140 is disposed above the optical films 130, so that the optical films 130 are located between the liquid crystal panel 140 and the light guide plate 120. The liquid crystal panel 140 has a display surface 142 and a rear surface 144, and the rear surface 144 is opposite to the display surface 142. The optical films 130 may be located opposite to the rear surface 144.

The light bar 150 is disposed opposite to the light incident side surface 126 and includes a first circuit board 152 and at least one light emitting element 154. The first circuit board 152 is, for example, a flexible circuit board, and the light emitting element 154 is, for example, a side-view type light emitting diode (LED). The light emitting element 154 is disposed on the first circuit board 152 and located opposite to the light incident side surface 126, thereby enabling to emit light rays to the light incident side surface 126.

When the light emitting element 154 emits light rays, the light rays from the light incident side surface 126 enter to the light guide plate 120. Then, the light rays are emitted from the light emitting surface 122 due to reflection or scattering. The light rays after emitted pass through the optical films 130 and the liquid crystal panel 140 in sequence. When the light rays pass through the liquid crystal panel 140, the liquid crystal panel 140 can control the transmittance of the light rays in each region of the display surface 142. Thus, the liquid crystal module 100 can show an image.

The light emitting element 154 is located between the first circuit board 152 and the bearing surface 112a, and the first circuit board 152 is located between the liquid crystal panel 140 and the light emitting surface 122. In this embodiment, the first circuit board 152 is located between the optical films 130 and the light emitting surface 122. However, in other embodiment, the first circuit board 152 may be located between the optical films 130 and the liquid crystal panel 140, and therefore the position of the first circuit board 152 as shown in FIG. 1 are provided as an example for illustration only, but not intended to limit the present invention.

The first circuit board 152 partially covers the light emitting surface 122. In detail, the first circuit board 152 does not completely cover the light emitting surface 122, but only covers a region of the light emitting surface 122 close to the light incident side surface 126. Therefore, when the light emitting element 154 emits light rays, light rays originally to be emitted from the region of the light emitting surface 122 close to the light incident side surface 122 are blocked by the first circuit board 152. Hence, the liquid crystal module 100 can reduce the occurrence of light leakage and non-uniform brightness of the screen, thereby maintaining or enhancing the picture quality of the LCD.

It is worth to note that in the embodiment as shown in FIG. 1, the number of the light emitting element 154 included in the light bar 150 is actually more than one. However, because of the influence from the viewing angle shown in FIG. 1, only one light emitting element 154 is shown in FIG. 1, and the rest of the light emitting elements 154 are covered by the housing 110 and not shown in FIG. 1. In addition, depending on the size of the liquid crystal module 100 and the type of the electronic device applying to the liquid crystal module 100, the number of the light emitting element 154 included in the light bar 150 may be only one. For example, when the liquid crystal module 100 is used as a screen of a mobile phone, the light bar 150 may include only one light emitting element 154.

The liquid crystal module 100 may further include a reflective sheet 160, and the reflective sheet 160 is disposed between the bearing surface 112a and the bottom surface 124. The light emitting element 154 is located between the first circuit board 152 and the reflective sheet 160. The reflective sheet 160 can reflect light rays and may be a metal sheet. When the light emitting element 154 emits light rays, the reflective sheet 160 can reflect the light rays emitted from the light emitting element 154, so as to enable the light rays to be emitted from the light emitting surface 122.

However, since the housing 110 may be a metal housing, the bearing surface 112a may have the ability to reflecting light rays. Therefore, when the housing 110 is a metal housing, even if the reflective sheet 160 does not exist, the bearing surface 112a also can reflect the light rays, so as to enable the light rays to be emitted from the light emitting surface 122. Thus it can be seen that the reflective sheet 160 as shown in FIG. 1 is only an optional element rather than an essential element of the present invention, and thus the present invention is not limited thereto.

The liquid crystal module 100 may include a second circuit board 170, at least one flexible flat cable (FFC) 180, and an electrical connector 190. The second circuit board 170 is, for example, a rigid circuit board. The FFC 180 is connected between the second circuit board 170 and the liquid crystal panel 140, and the liquid crystal panel 140 can be electrically connected to the second circuit board 170 through the FFC 180. The electrical connector 190 is mounted on the second circuit board 170. The second circuit board 170 has a mounting surface 172, and the electrical connector 190 is mounted on the mounting surface 172 and exposed beside the display surface 142.

The first circuit board 152 has a connection end E1, and the connection end E1 can be combined with and electrically connected to the electrical connector 190. Hence, the light emitting element 154 can be electrically connected to the second circuit board 170 through the first circuit board 152 and the electrical connector 190. In addition, a part of the first circuit board 152 may be located inside the housing 110, and the other part of the first circuit board 152 may be located outside the housing 110.

In detail, the first circuit board 152 may include a main body 152a and an extension part 152b. The light emitting element 154 is mounted on the main body 152a, and the extension part 152b has the connection end E1. The main body 152a is disposed inside the housing 110 and connected to the extension part 152b, and the extension part 152b is disposed outside the housing 110, so that a part of the first circuit board 152 is located inside the housing 110, and the other part is located outside the housing 110.

The frame wall 114 may further have an opening H1, and the opening H1 is located opposite to the light incident side surface 126. The extension part 152b extends from the main body 152a located inside the housing 110 towards the opening H1 and passes through the opening H1. Hence, the extension part 152b is disposed outside the housing 110, as shown in FIG. 1. In addition, the extension part 152b may be disposed on the mounting surface 172. In other words, the extension part 152b and the electrical connector 190 are located in the same plane of the second circuit board 170.

It is especially noted that some front covers of laptops are generally not provided with any openings or notches in the bottom at present. Therefore, when the housing 110 is the above first cover of the laptop, the connection portion between the bottom plate 112 and the frame wall 114 as well as the bottom plate 112 do not have any openings or notches, and the opening H1 only exists in the frame wall 114 rather than in the bottom plate 112 or the connection portion between the bottom plate 112 and the frame wall 114.

In addition, the first circuit board 152 may further include a handle part 152c, and the handle part 152c is connected to the extension part 152b. In the process of assembling the liquid crystal module 100, a worker can take the handle part 152c to move the first circuit board 152, so as to conveniently hold the light bar 150. In addition, in this embodiment, the extension part 152b may be located between the handle part 152c and the mounting surface 172, and the handle part 152c may be in a shape of a sheet. Furthermore, the handle part 152c may be pivotally connected to the extension part 152b, thereby rotating relative to the extension part 152b towards a direction close to or away from the second circuit board 170, as shown in FIG. 1.

Only the structure of the liquid crystal module 100 is described above. A method for assembling the liquid crystal module 100 is described in detail below with reference to FIG. 2A to FIG. 2C.

Figure 2A:
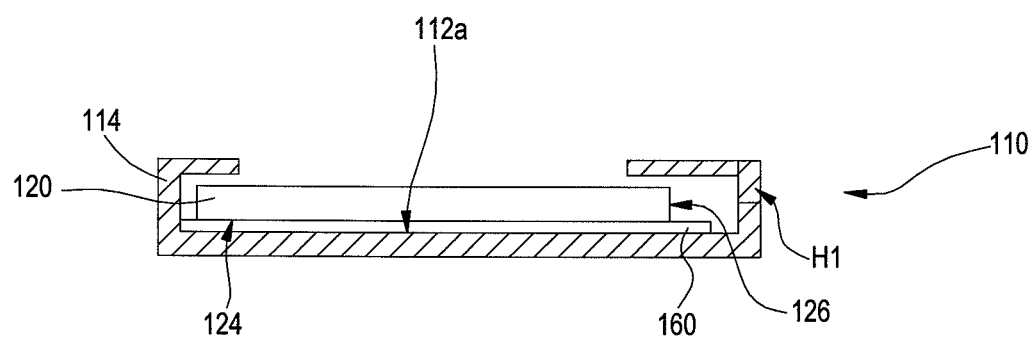
FIG. 2A to FIG. 2C are schematic diagrams of a method for assembling the liquid crystal module as shown in FIG. 1.
Figure 2B:
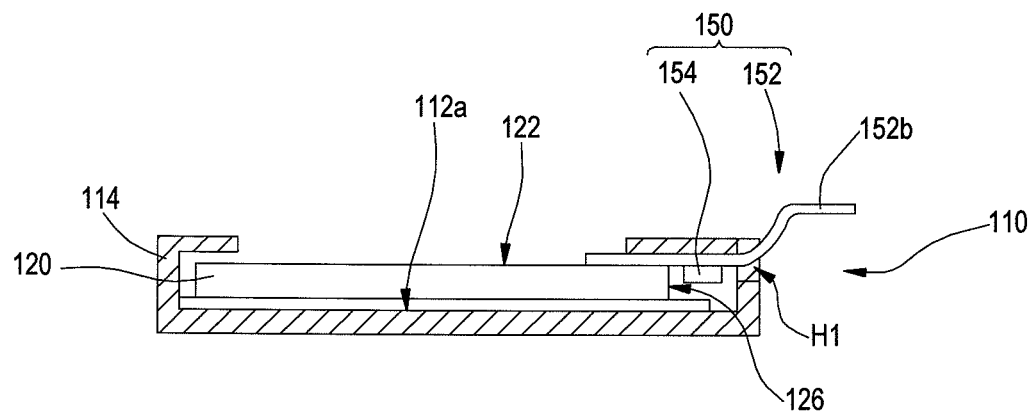
Figure 2C:
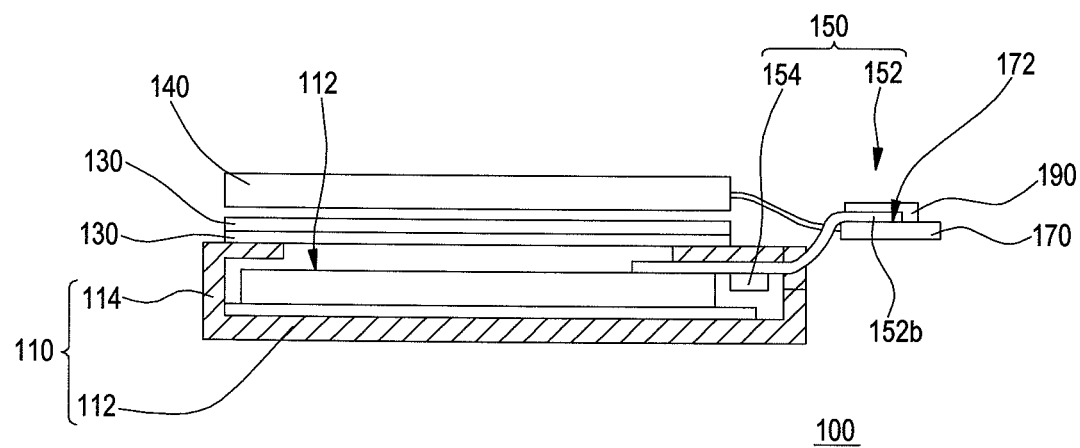

FIG. 2A to FIG. 2C are schematic diagrams of a method for assembling the liquid crystal module as shown in FIG. 1. Referring to FIG. 2A, in the method for assembling the liquid crystal module 100, the housing 100 is provided first. The housing 110 may be a housing employed by an electronic device, for example, a front cover (that is, Part A) of a laptop. Next, the light guide plate 120 is placed on the bearing surface 112a of the housing 110. After the light guide plate 120 is placed, the bottom surface 124 of the light guide plate 120 is located opposite to the bearing surface 112a, the frame wall 114 of the housing 110 surrounds the light guide plate 120, and the opening H1 in the frame wall 114 is located opposite to the light incident side surface 126.

Before the light guide plate 120 is placed, a reflective sheet 160 may be placed on the bearing surface 112a first, and the reflective sheet 160 after placed is located between the light guide plate 120 and the bearing surface 112a, as shown in FIG. 2A. However, it is necessary to note that the reflective sheet 160 is only an optional element rather than an essential element of the present invention so the reflective sheet 160 may be omitted, and the light guide plate 120 is directly placed on the bearing surface 112a when the bearing surface 112a has the ability to reflect light rays.

Referring to FIG. 2B, after the light guide plate 120 is placed on the bearing surface 112a, the light bar 150 including the first circuit board 152 and at least one light emitting element 154 is placed inside the housing 110. After the light bar 150 is placed, the light emitting element 154 is located opposite to the light incident side surface 126 and between the first circuit board 152 and the bearing surface 112a, and the first circuit board 152 partially covers the light emitting surface 122. In addition, in the process of placing the light bar 150, the extension part 152b may be passed through the opening H1 such that the extension part 152b is located outside the housing 110.

Referring to FIG. 2C, at least one optical film 130 is then placed above the light emitting surface 122. In the embodiment as shown in FIG. 2C, the number of the optical film 130 is plural, and the optical films 130 may be placed after the light bar 150 is placed. Therefore, the first circuit board 152 is located between the optical films 130 and the light emitting surface 122. Then, a liquid crystal panel 140 is placed above the optical films 130.

Referring to FIG. 1 and FIG. 2C, after the liquid crystal panel 140 is placed, the connection end E1 of the first circuit board 152 (as shown in FIG. 1) may be combined with and electrically connected to the electrical connector 190. In a method for combining and electrically connecting the connection end E1 and the electrical connector 190, the connection end E1 may be inserted into the electrical connector 190, as shown in FIG. 1. After the connection end E1 is inserted into the electrical connector 190, the extension part 152b is placed on the mounting surface 172 of the second circuit board 170. After the liquid crystal panel 140 is placed, the assembling of the liquid crystal module 100 is substantially completed.

It can be known from the above method for assembling the liquid crystal module 100 that the light bar 150 is placed after the light guide plate 120 is placed, and the first circuit board 152 partially covers the light emitting surface 122 of the light guide plate 120. Therefore, when the housing 110 is a front cover of a laptop without any openings or notches in the bottom at present, the first circuit board 152 does not extend from the bottom plate 112 to the outside of the housing 110, but extends from the frame wall 114 to the outside of the housing 110. Therefore, the method for assembling is quite applicable to a liquid crystal module having the front cover of the above laptop.

Based on the above description, in the liquid crystal module of the present invention, since the first circuit board of the light bar partially covers the light emitting surface of the light guide plate, some light rays originally to be emitted from the region of the light emitting surface close to the light incident side surface are blocked. Hence, the liquid crystal module of the present invention can reduce the occurrence of light leakage and non-uniform brightness of the screen, thereby maintaining or enhancing the picture quality of the LCD.

In addition, in one of the embodiment in the present invention, after the light bar and the liquid crystal panel are placed, the electrical connector is exposed beside the display surface of the liquid crystal panel. Therefore, a worker can combine the first circuit board of the light bar with the electrical connector from the display surface of the liquid crystal panel without inverting the whole liquid crystal module. Hence, the present invention can facilitate the worker to assemble the liquid crystal module, so as to accelerate the assembling of the liquid crystal module.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A liquid crystal module, comprising:
   a housing, comprising a bottom plate and a frame wall, wherein the bottom plate has a bearing surface, and the frame wall is connected to the bottom plate and protrudes from the bearing surface;
   a light guide plate, disposed on the bearing surface and having a light emitting surface, a bottom surface, and a light incident side surface connected between the light emitting surface and the bottom surface, wherein the bottom surface is located opposite to the bearing surface, and the frame wall surrounds the light guide plate;

at least one optical film, disposed above the light emitting surface;

a liquid crystal panel, disposed above the optical film;

a light bar, comprising a first circuit board and at least one light emitting element, wherein the light emitting element is mounted on the first circuit board and located opposite to the light incident side surface, and between the first circuit board and the bearing surface, and the first circuit board is located between the liquid crystal panel and the light emitting surface, and partially covers the light emitting surface;

a second circuit board, having a mounting surface;

a flexible flat cable (FFC), connected between the second circuit board and the liquid crystal panel; and an electrical connector, mounted on the mounting surface, wherein the first circuit board has a connection end, and the connection end and the electrical connector are combined with and electrically connected to each other;

wherein the first circuit board comprises:
- an extension part, having the connection end and disposed on the mourning surface;
- a main body, connected to the extension part, wherein the light emitting element is mounted on the main body; and
- a handle part connected to the extension part, wherein the extension part is located between the handle part and the mounting surface.

2. The liquid crystal module according to claim 1, further comprising a reflective sheet, wherein the reflective sheet is disposed between the bearing surface and the bottom surface, and the light emitting element is located between the first circuit board and the reflective sheet.

3. The liquid crystal module according to claim 1, wherein the first circuit board is a flexible circuit board.

4. The liquid crystal module according to claim 1, wherein the light emitting element is a side-view type light emitting diode (LED).

5. The liquid crystal module according to claim 1, wherein the first circuit board is located between the optical film and the light emitting surface.

6. The liquid crystal module according to claim 1, wherein the frame wall further has an opening located opposite to the light incident side surface, and the extension part passes through the opening and is located outside the housing.

7. The liquid crystal module according to claim 1, wherein the handle part is in a shape of a sheet, and the handle part is pivotally connected to the extension part.

8. The liquid crystal module according to claim 1, wherein the liquid crystal panel has a display surface and a rear surface opposite to the display surface, the optical film is located opposite to the rear surface, and the electrical connector is exposed beside the display surface.

9. The liquid crystal module according to claim 1, wherein the second circuit board is a rigid circuit board.

10. A method for assembling a liquid crystal module, comprising:

providing a housing comprising a bottom plate and a frame wall, wherein the bottom plate has a bearing surface, and the frame wall is connected to the bottom plate and protrudes from the bearing surface;

placing a light guide plate on the bearing surface, wherein the light guide plate has a light emitting surface, a bottom surface, and a light incident side surface connected between the light emitting surface and the bottom surface, and the bottom surface is located opposite to the bearing surface, and the frame wall surrounds the light guide plate;

placing a light bar inside the housing after the light guide plate is placed on the bearing surface, wherein the light bar comprises a first circuit board and at least one light emitting element, the light emitting element is mounted on the first circuit board and located opposite to the light incident side surface, and between the first circuit board and the bearing surface, and the first circuit board partially covers the light emitting surface;

placing at least one optical film above the light emitting surface; and placing a liquid crystal panel above the optical film, wherein the first circuit board is located between the liquid crystal panel and the light emitting surface;

wherein:

a flexible flat cable (FFC) is electrically connected between a second circuit board and the liquid crystal panel, the second circuit board has amounting surface electrical connector is mounted on the mounting surface, and the method further comprises combining and electrically connecting a connection end of the first circuit board and the electrical connector after the liquid crystal panel is placed; and the first circuit board comprises:
- an extension part, having the connection end and disposed on the mounting surface;
- a main body, connected to the extension part, wherein the light emitting element is mounted on the main body; and
- a handle part connected to the extension part, wherein the extension part is located between the handle part and the mounting surface.

11. The method for assembling a liquid crystal module according to claim 10, wherein the optical film is placed after the light bar is placed inside the housing.

12. The method for assembling a liquid crystal module according to claim 10, wherein the frame wall further has an opening located opposite to the light incident side surface, and a method for placing the light bar inside the housing further comprises:

passing the extension part through the opening such that the extension part is located outside the housing.

13. The method for assembling a liquid crystal module according to claim 10, further comprising placing a reflective sheet on the bearing surface before the light guide plate is placed.

* * * * *